(12) United States Patent
Jo (10) Patent No.: US 11,495,442 B2
(45) Date of Patent: Nov. 8, 2022

(54) BATCH TYPE SUBSTRATE PROCESSING APPARATUS

(71) Applicant: EUGENE TECHNOLOGY CO., LTD., Yongin-Si (KR)

(72) Inventor: Jeong Hee Jo, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 275 days.

(21) Appl. No.: 16/842,755

(22) Filed: Apr. 7, 2020

(65) Prior Publication Data

US 2020/0350143 A1 Nov. 5, 2020

(30) Foreign Application Priority Data

May 2, 2019 (KR) .................. 10-2019-0051754

(51) Int. Cl.
*H01J 37/32* (2006.01)

(52) U.S. Cl.
CPC .. *H01J 37/32532* (2013.01); *H01J 37/32009* (2013.01); *H01J 2237/3321* (2013.01)

(58) Field of Classification Search
CPC .......... H01J 37/32532; H01J 37/32009; C23C 16/4587
See application file for complete search history.

(56) References Cited

U.S. PATENT DOCUMENTS

| 2012/0202352 A1 | 8/2012 | Takagi | |
| 2015/0107517 A1* | 4/2015 | Hasebe | C23C 16/452 118/723 R |
| 2019/0108985 A1 | 4/2019 | Kang et al. | |
| 2019/0157049 A1* | 5/2019 | Sato | C23C 16/52 |

FOREIGN PATENT DOCUMENTS

| JP | S63137419 A | 6/1988 |
| JP | H05234950 A | 9/1993 |
| JP | 2002280378 A | 9/2002 |
| JP | 2004124234 A | 4/2004 |
| JP | 2006303516 A | 11/2006 |
| JP | 2008300444 A | 12/2008 |
| JP | 2009200275 A | 9/2009 |
| JP | 2010226084 A | 10/2010 |
| JP | 2011009699 A | 1/2011 |
| JP | 2011114230 A | 6/2011 |
| JP | 2011135010 A | 7/2011 |
| JP | 2012114340 A | 6/2012 |
| JP | 2016213033 A | 12/2016 |
| KR | 101396602 B1 | 5/2014 |
| KR | 20190032922 A | 3/2019 |
| WO | 2018016131 A1 | 1/2018 |
| WO | WO2018-016131 * | 1/2018 |
| WO | 2019035223 A1 | 2/2019 |

\* cited by examiner

*Primary Examiner* — Joseph A Miller, Jr.

(74) *Attorney, Agent, or Firm* — Renaissance IP Law Group LLP (57) ABSTRACT

Provided is a substrate processing apparatus. The substrate processing apparatus includes a tube configured to provide a processing space, a partition wall configured to provide a discharge space in which plasma is generated, a gas supply pipe configured to supply a process gas to the discharge space, and a plurality of electrodes disposed outside the tube to generate the plasma in the discharge space. The tube has a plurality of recesses recessed inward from the outermost circumferential surface of the tube, and the plurality of electrodes are accommodated in the plurality of recesses, respectively.

11 Claims, 6 Drawing Sheets

BATCH TYPE SUBSTRATE PROCESSING APPARATUS

CROSS-REFERENCE TO RELATED APPLICATION

This application claims priority to Korean Patent Application No. 10-2019-0051754 filed on May 2, 2019 and all the benefits accruing therefrom under 35 U.S.C. § 119, the contents of which are incorporated by reference in their entirety.

BACKGROUND

The present disclosure relates to a batch type substrate processing apparatus, and more particularly, to a batch type substrate processing apparatus which provides a process gas decomposed in a separate space into a processing space.

In general, substrate processing apparatus that locates a substrate to be processed within a processing space to deposit reaction particles contained in a process gas injected into the processing space by using chemical vapor deposition or atomic layer deposition. The substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time.

Generally, in the batch type substrate processing apparatus, a wall surface of the processing space as well as the substrate increases in temperature by a hot wall type heating unit surrounding the processing space. As a result, undesired thin films are formed on the inner wall surface of the processing space by the process gases. Here, when a process environment such as plasma is created in the processing space, the thin film deposited on the inner wall are separated as particles by magnetic fields or electric fields generated in the plasma generation space to serve as contaminants during the substrate processing process. As a result, quality of the thin film on the substrate may be deteriorated, and also, efficiency of the substrate processing process may be deteriorated.

SUMMARY

The present disclosure provides a batch type plasma substrate processing apparatus which provides a process gas decomposed in a separate space into a processing space.

In accordance with an exemplary embodiment, a batch type substrate processing apparatus includes: a tube configured to provide a processing space in which a plurality of substrates are accommodated; a partition wall extending in a longitudinal direction of the tube and disposed inside the tube to provide a discharge space which is separated from the processing space and in which plasma is generated; a gas supply pipe configured to supply a process gas required for processing the plurality of substrates to the discharge space; and a plurality of electrodes extending in the longitudinal direction of the tube and disposed outside the tube to generate the plasma in the discharge space. The tube may have a plurality of recesses extending in the longitudinal direction of the tube and recessed inward from the outermost circumferential surface of the tube, and the plurality of electrodes may be accommodated in the plurality of recesses, respectively.

The plurality of recesses may be disposed to be spaced apart from each other in the circumferential direction of the tube.

Distances between the plurality of recesses may be the same.

An opened inlet of each of the plurality of recesses may have a width less than a maximum width of an inner space of each of the plurality of recesses, in the circumferential direction of the tube.

At least one of the plurality of recesses may have a depth different from that of each of the rest recesses, when based on the outermost circumferential surface of the tube.

The plurality of electrodes may include a plurality of power electrodes to which RF power is applied and a ground electrode that is grounded, and the recess which is disposed at an intermediate portion and in which the ground electrode is accommodated may have a depth greater than that of each of the rest recesses among the plurality of recesses.

The plurality of electrodes may contact inner surfaces of the plurality of recesses, respectively, and the batch type substrate processing apparatus may further include a protective cover configured to cover the plurality of electrodes and a portion of an outer wall of the tube.

The gas supply pipe may be disposed outside the partition wall in the circumferential direction of the tube.

The partition wall may extend from each of the recesses that are disposed at outer sides among the plurality of recesses.

The gas supply pipe may supply the process gas into spaces between the plurality of electrodes from the outside of the tube.

The batch type substrate processing apparatus may further include an RF power source configured to supply pulsed RF power having a pulse frequency band of approximately 1 kHz to approximately 10 kHz to a portion of the plurality of electrodes so that the plasma is periodically turned on/off.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, the dimensions of layers and regions are exaggerated for clarity of illustration. Like reference numerals refer to like elements throughout.

Figure 1:
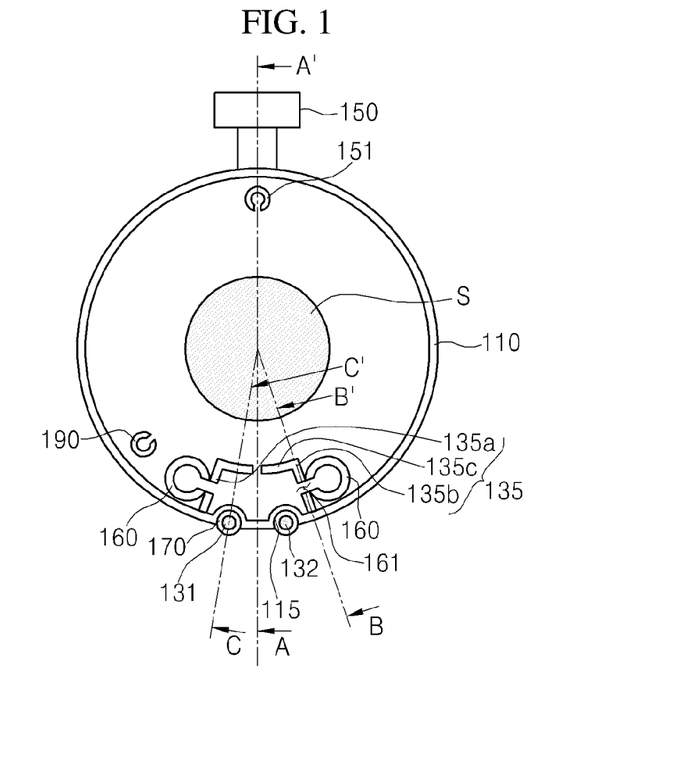
FIG. 1 is a plan view of a substrate processing apparatus in accordance with an exemplary embodiment.
Figure 2A:
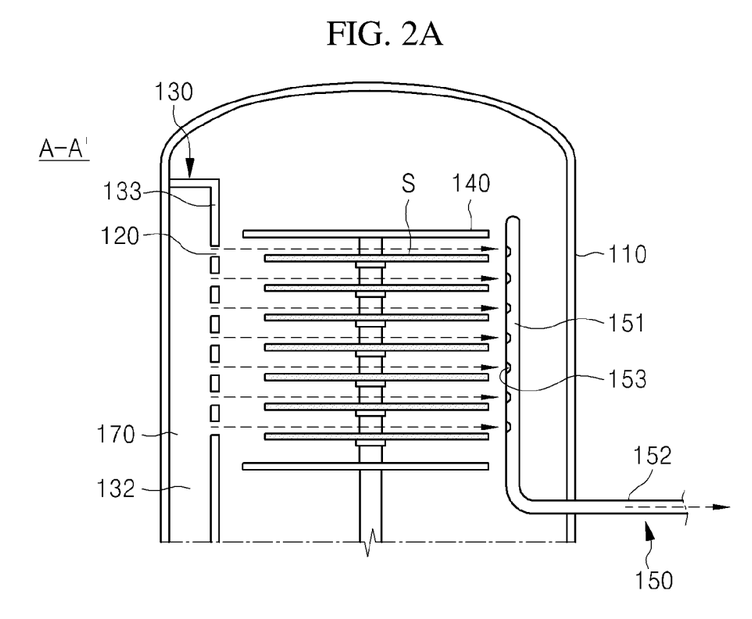
FIG. 2A is a cross-sectional view taken along lien A-A' of FIG. 1.
Figure 2B:
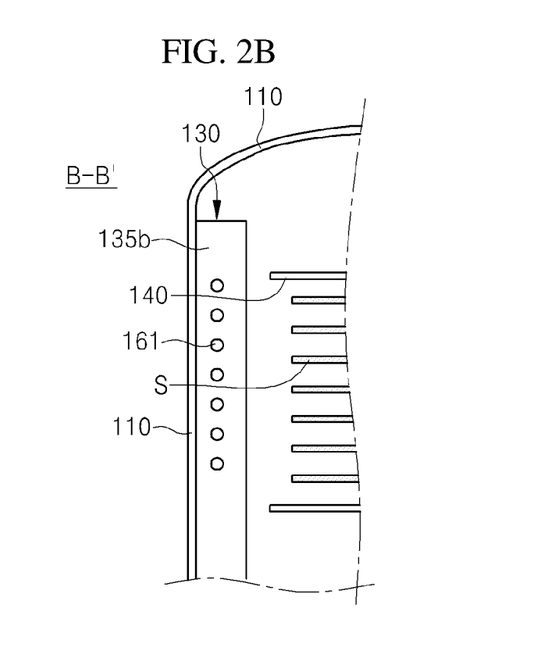
FIG. 2B is a cross-sectional view taken along line B-B' of FIG. 1.
Figure 2C:
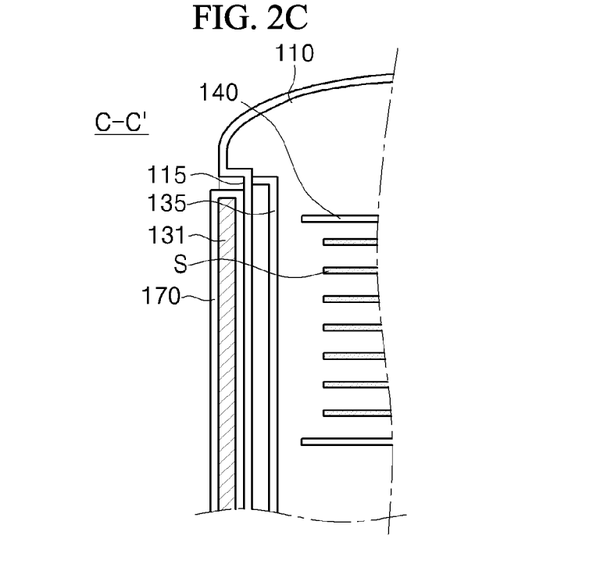
FIG. 2C is a cross-sectional view taken along line C-C' of FIG. 1.

FIG. 1 is a plan view of a substrate processing apparatus in accordance with an exemplary embodiment, FIG. 2A is a cross-sectional view taken along lien A-A' of FIG. 1, FIG. 2B is a cross-sectional view taken along line B-B' of FIG. 1, and FIG. 2C is a cross-sectional view taken along line C-C' of FIG. 1.

Referring to FIGS. 1 and 2, a substrate processing apparatus in accordance with an exemplary embodiment may include a tube 110 providing a processing space in which a plurality of substrates S are processed, a substrate support unit 140 which loads the plurality of substrates S in the processing space in a first direction, i.e., in a longitudinal direction of the tube 110, an exhaust unit 150 communicating with the tube 110 to exhaust process residues within the processing space to the outside, a partition wall 135 extending in the longitudinal direction of the tube 110, disposed inside the tube 110 so as to be separated from the processing space, and providing a discharge space in which plasma is generated, a gas supply pipe 160 supplying a process gas required for processing the plurality of substrates S to the discharge space, and a plurality of electrodes 131 and 132 extending in the longitudinal direction of the tube 110 and disposed outside the tube 110 to generate the plasma in the discharge space. The tube 110 may have a plurality of recesses 115, for example, two recesses 115, which extend in the longitudinal direction of the tube 110 and are recessed inward from the outermost circumferential surface of the tube 110. The plurality of electrodes 131 and 132 may be accommodated in the plurality of recesses 115, respectively. Here, the outermost circumferential surface of the tube 110 means the outermost circumferential surface except for the recesses 115.

The tube 110 may have a cylindrical shape with a closed upper portion and an opened lower portion and made of a heat resistance material such as ceramic. The tube 110 may provide the processing space in which the plurality of substrates S are accommodated and processed. The processing space of the tube 110 may be a space in which the substrate support unit 140, which loads the plurality of substrates S in a first direction, i.e., in a vertical direction of the tube 110, is accommodated, and the processing process (e.g., a deposition process) is actually performed. A plurality of recesses 115 that are recessed inward from the outermost circumferential surface of the tube 110 may be provided in one area of the tube 110, for example, an area of the tube 110, which faces the exhaust unit 150. The plurality of recesses 115 may extend in the longitudinal direction of the tube 110 and may be disposed spaced apart from each other in the circumferential direction of the tube 110. An opened inlet of each of the plurality of recesses 115 may have a width $W_o$ less than a maximum width $W_M$ of the inner space of each of the plurality of recesses 115 in the circumferential direction of the tube 110.

The substrate support unit 140 may be configured to support the substrates S so as to load the plurality of substrates S in the first direction, i.e., in the vertical direction and provide a plurality of unit processing spaces in which the plurality of substrates S are individually processed. That is, the substrate support unit 140 may provide a plurality of layers so that the substrates S are loaded in the first direction. Here, one substrate S may be loaded on one layer (or a unit processing space). Thus, the unit processing space for each substrate S may be individually defined on each layer of the substrate support unit 140 to prevent the unit processing spaces from interfering with each other. When the plurality of substrates S are all loaded on the substrate support unit 140, the substrate support unit 140 may move to the processing space in the tube 110 through a lower portion (or entrance) of the tube 110. The substrate support unit 140 is not particularly limited in form or structure as long as the substrate support unit 140 mounts and supports the plurality of substrates S thereon.

The gas supply pipe 160 may be configured so that the process gas required for the process of processing the plurality of substrates S may be supplied into the tube 110 through the plasma reaction unit 130.

The plasma reaction unit 130 includes a component that includes the partition wall 135 and the plurality of electrodes 131 and 132, decomposes or activates the process gas supplied from the gas supply pipe 160 by using the plasma, and provides only radicals of the process gas into the processing space.

The partition wall 135 may include sub sidewalls 135a and 135b, which are disposed inside the tube 110 and connected to an inner wall of the tube 110 and a main sidewall 135c between the sub sidewalls 135a and 135b. The partition wall 135 may include the sub sidewalls 135a and 135b extending to the inside of the tube 110 from the inner wall of the tube 110 and spaced apart from each other and the main sidewalls 135c disposed between the sub sidewalls 135a and 135b and spaced apart from the plurality of recesses 115 of the tube 110. The sub sidewalls 135a and 135b and the main sidewall 135c may extend in the longitudinal direction of the tube 110 along the inner wall of the tube 110. However, the partition wall 135 is not limited to the shape illustrated in FIG. 1 as long as the partition wall 135 provides the discharge space that is separated from the processing process.

The plurality of electrodes 131 and 132 are disposed outside the tube 110 and include a first electrode 131 and a second electrode 132 accommodated in the plurality of recesses 115, respectively. Each of the first electrode 131 and the second electrode 132 may be accommodated in the plurality of recesses 115 in a state of being surrounded by the protective tube 170 from an upper portion to a lower portion thereof.

Since the inlet of each of the plurality of recesses 115 has the width $W_o$ less than the maximum width $W_M$ of the inner space in the circumferential direction of the tube 110, the first electrode 131 and the second electrode 132 may be stably mounted in the plurality of recesses 115 in the state of being surrounded by the protective pipe 170. In order to stably mount the first electrode 131 and the second electrode 132 in the plurality of recesses 115, the width $W_o$ of the inlet of each of the plurality of recesses 115 may be more less than a maximum width of the protective pipe 17 in the circumferential direction of the tube 110, and an inner surface of each of the plurality of recesses 115 and an outer surface of the protective pipe 170 may contact each other. In the state in which the first electrode 131 and the second electrode 132 are accommodated in the plurality of recesses 115, central axes of the first electrode 131 and the second electrode 132 may be disposed inside the outer wall of the tube 110.

The first electrode 131 may be connected to an RF power source, and the second electrode 132 may be grounded. The first electrode 131 may be referred to as a power electrode, and the second electrode 132 may be referred to as a ground electrode.

The first electrode 131 and the second electrode 132 may extend in the first direction in which the plurality of substrates S are loaded, i.e., in the longitudinal direction of the tube 110. Here, the first electrode 131 and the second electrode 132 may be disposed to be spaced apart from each other. Also, the RF power may be applied to the first electrode 131 to generate capacitive coupled plasma (CCP) in the discharge space by electric fields generated between the first electrode 131 and the second electrode 132.

In general, a skin effect in which current flows along a surface thereof may occur in electrical conduction due to the use of the RF frequency. Here, when a net-type mesh electrode is used, since an area occupied by the empty space is wide, the RF power is inefficiently applied by large resistance due to a small surface area. Furthermore, the substrate processing process is repeatedly performed at high and low temperatures. When the net-type mesh electrode is used, the mesh electrode may be irregularly changed in shape in accordance with a temperature change and thus be disadvantageous in terms of shape retention. In addition, since resistance is changed in accordance with the changed shape, when the RF power is applied, non-uniform plasma may be generated.

In order to prevent the above-mentioned limitations, each of the first electrode 131 and the second electrode 132 in accordance with an exemplary embodiment may be inserted into the protective pipe 170 and also be provided in the braided type (braided wire) having flexibility. In an exemplary embodiment, in order to further reduce the empty space, a method of applying a metal on the surface of each of the electrodes may be additionally performed.

The protective pipe 170 may surround the outside of each of the first electrode 131 and the second electrode 132 to electrically insulate the first and second electrodes 131 and 132 and also may protect the electrodes, which are exposed to the plasma atmosphere, from the plasma. Thus, the first electrode 131 and the second electrode 132 may be safely protected from the contamination or particles that are generated by plasma. The protective pipe 170 may be made of a heat-resistant material such as quartz or ceramic.

As the RF power applied to stably generate the plasma or obtain a desired amount of radicals increases, the protective pipe 170, which protects the first and second electrodes 131 and 132, and the partition wall 135 may be damaged by ions having high energy, and thus, particles may be generated. When the protective pipe 170 is damaged, the internal electrode 132 may also be damaged or contaminated.

In an exemplary embodiment, the first and second electrodes 131 and 132, to which the RF power is applied to generate the plasma in the discharge space, may be disposed in the recesses 115 outside the tube 110 to prevent the first electrode 131 and the protective pipe 170 from being damaged by the plasma.

Figure 8:
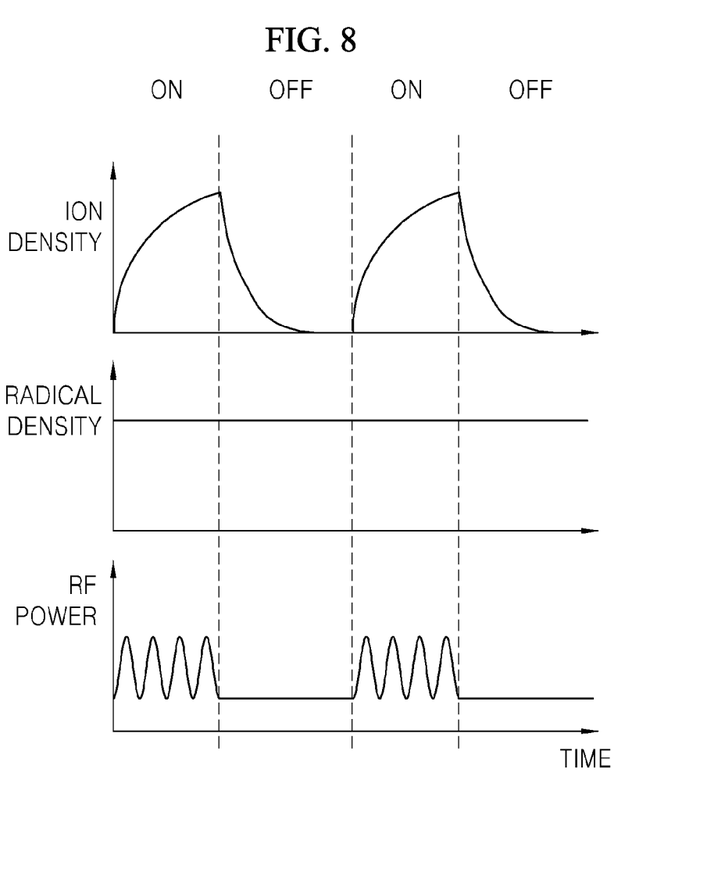
FIG. 8 is a view illustrating an ion density and a radical density depending on application of pulsed RF power in accordance with an embodiment.

Also, the RF power source may supply pulsed RF power to the first electrode 131. The pulsed RF power may be adjusted in pulse width and duty ratio in a pulse frequency range of approximately 1 kHz to approximately 10 kHz. When the pulsed RF power is applied to the first electrode 131, the plasma may be periodically turned on/off, i.e., the plasma may be generated in the form of a pulse. Thus, the density of the ions that damage the partition wall and generate the particles during the processing process may be reduced, whereas the density of the radicals may be constantly maintained (see FIG. 8). In accordance with the exemplary embodiment, the partition wall 135 may be prevented from being damaged by the plasma while maintaining the efficiency of the processing process. In general, the RF power may have a frequency of approximately 0.1 MHz to several hundred MHz.

The first electrode 131, the second electrode 132, and the third electrode 160 may be spaced apart from each other in the circumferential direction of the tube 110. At least one gas supply pipe 160 may be disposed outside the partition wall 135. For example, as illustrated in FIG. 1, two gas supply pipes 160 may be respectively disposed at one side and the other side of the partition wall 135 in the circumferential direction of the tube 110. That is, the two gas supply pipes 160 may be disposed outside the first and second sub sidewalls 135a and 135b to supply the process gas to the discharge space. On the other hand, one gas supply pipe 160 may be disposed only at one side or the other side of the partition wall 135 in the circumferential direction of the tube 110. The gas supply pipe 160 may have a plurality of supply holes 161 arranged in the first direction, i.e., in the longitudinal direction of the tube 110.

When the gas supply pipe 160 is disposed inside the partition wall 135, a dead zone in which the plasma is not generated may be defined in a space around the gas supply pipe 160. Also, when the plurality of supply holes of the gas supply pipe 160 disposed inside the partition wall 135 are disposed toward the partition wall 135, an eddy may be generated inside the partition wall 135, and thus, it takes a time to generate a uniform pressure to the discharge space inside the partition wall 135.

In an exemplary embodiment, the gas supply pipe 160 may be disposed outside the partition wall 135 in the circumferential direction of the tube 110, i.e., disposed outside the first and second sub sidewalls 135a and 135b to directly supply the process gas into the discharge space inside the partition wall 135, thereby diffusing the process gas. Thus, an eddy may not be generated, and the uniform pressure may be generated in the discharge space within a short time. Also, in an exemplary embodiment, since the first electrode 131, the second electrode 132, and the gas supply pipe 160 are disposed outside the discharge space, the discharge space may be reduced in size to generate the uniform pressure in the discharge space within the short time.

A plurality of injection holes 120 through which the radicals of the process gas decomposed in the plasma reaction unit 130 are injected into the processing space may be defined in the plasma reaction unit 130. The plurality of injection holes 120 may be defined in the main sidewall 135c of the partition wall 135. The plurality of injection holes 120 may be defined in positions corresponding between the first electrode 131 and the third electrode 133. The plurality of injection holes 20 may be arranged in the first direction, i.e., in the longitudinal direction of the tube 110 to correspond to the unit processing spaces of the substrate support unit 140 so that the radicals are supplied to the plurality of substrates S, respectively.

When the process gas is directly supplied to the processing space within the tube 110 to generate the plasma in the processing space, a thin film formed on the inner wall of the tube 110 may be separated as particles while the processing process is performed by magnetic fields or electric fields for generating the plasma. In an exemplary embodiment, the separator plasma reaction unit 130 may be provided in the tube 110, i.e., the discharge space in which the plasma is generated and the processing space in which the substrates S are processed may be separated from each other to prevent the thin film formed on the inner wall of the tube 110 from being separated as the particles while the processing process is performed.

The exhaust unit 150 may be disposed to face the plasma reaction unit 130. The exhaust unit 150 may be disposed in the processing space to exhaust process residues within the processing space to the outside. The exhaust unit 150 may be constituted by an exhaust member 151 extending in the first direction, i.e., in the longitudinal direction of the tube 110 and an exhaust line and exhaust pump (not shown), which are connected to the exhaust member 151. The exhaust member 151 may be provided with a plurality of exhaust holes 153 facing the injection holes of the plasma reaction unit 130 and arranged in the first direction, i.e., in a vertical direction to correspond to the unit processing spaces of the substrate support unit 140, respectively.

As described above, since the injection holes 120 of the plasma reaction unit 130 and the exhaust holes 153 of the exhaust unit 150 correspond to each other to be disposed in the same line in a second direction (for example, a direction parallel to surfaces of the substrates S) crossing the first direction in which the substrates S are loaded, the radicals injected from the injection holes 120 may laminar-flow while being introduced into the exhaust holes 153. Thus, the radicals injected from the injection holes 120 may be uniformly supplied to top surfaces of the substrates S.

The substrate processing apparatus according to an exemplary embodiment may further include a source gas supply pipe 190 that supplies a source gas to the processing space in the tube 110. The source gas supply pipe 190 is disposed in the tube 110 and may be disposed at one side of the plasma reaction unit 130.

The process gas may include one or more kinds of gases, that is, a source gas and a reaction gas that reacts with the source gas to generate a thin film material. The source gas supply pipe 190 may directly supply the source gas to the processing space. Unlike the source gas supply pipe 190 that directly supplies the source gas to the processing space, the gas supply pipe 160 may supply the reaction gas first into the plasma reaction unit 130, and the reaction gas may be activated by the plasma and then supplied to the processing space in a radical state. For example, when the thin film material to be deposited on the substrates S is silicon nitride, the source gas may include a silicon-containing gas, dichlorosilane ($SiH_2Cl_2$, abbreviation: DCS), and the like, and the reaction gas may include a nitrogen-containing gas, $NH_3$, $N_2O$, NO, and the like.

In an exemplary embodiment, since the reaction gas having a relatively higher gas decomposition temperature than the source gas is supplied to the plasma reaction unit 130, the reaction gas may be effectively decomposed by the plasma reaction unit 130 and be supplied to the processing space.

The substrate processing apparatus in accordance with an exemplary embodiment may further include a heating unit surrounding the tube 110 to heat the plurality of substrates S and a rotation unit connected to a lower portion of the substrate support unit 140 to allow the substrates to rotate so as to realize uniformity of the processing process.

Figure 3:
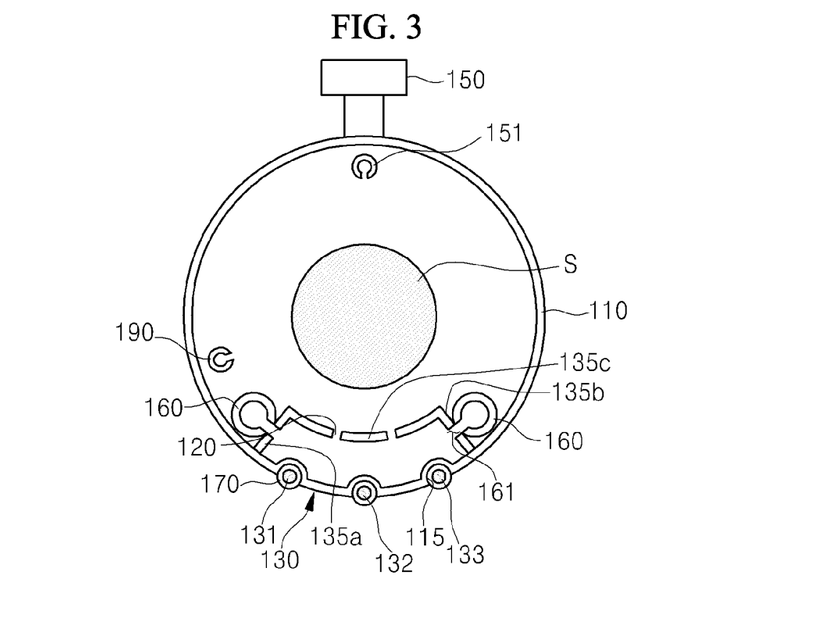
FIG. 3 is a plan view of a substrate processing apparatus in accordance with an exemplary embodiment.

FIG. 3 is a plan view of a substrate processing apparatus in accordance with an exemplary embodiment.

Referring to FIG. 3, the substrate processing apparatus according to an embodiment of the present invention is the same as or similar to the substrate processing apparatus of FIG. 1 except for a plasma reaction unit 130, and thus, following description will mainly focus on differences.

The substrate processing apparatus in accordance with an exemplary embodiment may include a tube 110 providing a processing space in which a plurality of substrates S are processed, a substrate support unit 140 which loads the plurality of substrates S in the processing space in a first direction, i.e., in a vertical direction, an exhaust unit 150 communicating with the tube 110 to exhaust process residues within the processing space to the outside, a partition wall 135 extending from the tube 110 so as to be separated from the processing space and providing a discharge space in which plasma is generated, a gas supply pipe 160 supplying a process gas required for processing the plurality of substrates S to the inside of the partition wall 135, and a plurality of electrodes 131 and 132 extending in the longitudinal direction of the tube 110 and disposed outside the tube 110 to generate the plasma in the discharge space. The tube 110 may have a plurality of recesses 115, for example, three recesses 115, which extend in the longitudinal direction of the tube 110 and are recessed inward from the outermost circumferential surface of the tube 110. The plurality of electrodes 131, 132, and 133 may be accommodated in the plurality of recesses 115, respectively.

A plurality of recesses 115 that are recessed inward from the outermost circumferential surface of the tube 110 may be provided in one area of the tube 110, for example, an area of the tube 110, which faces the exhaust unit 150. The plurality of recesses 115 may extend in the longitudinal direction of the tube 110 and may be disposed spaced apart from each other in the circumferential direction of the tube 110.

In order to uniformly generate the plasma in spaces between the plurality of recesses 115, distance between the plurality of recesses 115 may be the same as each other. An inlet of each of the plurality of recesses 115 may have a width $W_o$ less than a maximum width $W_M$ of the inner space of each of the plurality of recesses 115 in the circumferential direction of the tube 110.

The plurality of electrodes 131, 132, and 133 include a first electrode 131, a second electrode 132, and a third electrode 133, which are disposed outside the tube 110 and respectively accommodated in the plurality of recesses 115. Each of the first electrode 131, the second electrode 132, and the third electrode 133 may be accommodated in the plurality of recesses 115 in a state of being surrounded by the protective tube 170 from an upper portion to a lower portion thereof. The second electrode 132 may be accommodated in the recess 115 defined in an intermediate portion of the plurality of recesses 115, and the first and third electrodes 131 and 133 may be accommodated in the recesses 115, which are disposed at outer sides of the plurality of recesses 115.

Since the inlet of each of the plurality of recesses 115 has the width $W_o$ less than the maximum width $W_M$ of the inner space in the circumferential direction of the tube 110, the first electrode 131, the second electrode 132, and the third electrode 133 may be stably mounted in the plurality of recesses 115 in the state of being surrounded by the protective pipe 170. In order to stably mount the first electrode 131, the second electrode 132, and the third electrode 133 in the plurality of recesses 115, the width $W_o$ of the inlet of each of the plurality of recesses 115 may be more less than a maximum width of the protective pipe 17 in the circumferential direction of the tube 110, and an inner surface of each of the plurality of recesses 115 and an outer surface of the protective pipe 170 may contact each other. In the state in which the first to third electrodes 131, 132, and 133 are accommodated in the plurality of recesses 115, central axes of the first electrode 131, the second electrode 132, and the third electrode 133 may be disposed inside the outer wall of the tube 110.

The first and third electrodes 131 and 133 may be connected to an RF power source, and the second electrode 132 may be grounded. Each of the first and third electrodes 131 and 133 may be referred to as a power electrode, and the second electrode 132 may be referred to as a ground electrode.

The first electrode 131, the second electrode 132, and the third electrode 133 may extend in the first direction in which the plurality of substrates S are loaded, i.e., in the longitudinal direction of the tube 110. Here, the first electrode 131, the second electrode 132, and the third electrode 133 are disposed to be spaced apart from each other, and RF power is applied to each of the first electrode 131 and the third electrode 133, capacitive coupled plasma (CCP) may be generated in the discharge space by electric fields generated between the first and second electrodes 131 and 132 and between the second and third electrodes 132 and 133.

In order to uniformly generate the plasma in the spaces between the first electrode 131 and the second electrode 132 and between the second electrode 132 and the third electrode 133, a distance between the first electrode 131 and the second electrode 132 and a distance between the second electrode 132 and the third electrode 133 have to be the same as each other. Since the distances between the plurality of recesses 115 are the same, the distance between the first electrode 131 and the second electrode 132 may be the same as that between the second electrode 132 and the third electrode 133. The plurality of recesses 115 may be the same depth as each other based on the outer wall of the tube 110.

As the RF power applied to stably generate the plasma or obtain a desired amount of radicals increases, the protective pipe 170, which protects the first and second electrodes 131 and 132, and the partition wall 135 may be damaged by ions having high energy, and thus, particles may be generated. When the protective pipe 170 is damaged, the internal electrode 132 may also be damaged or contaminated.

In an exemplary embodiment, the first electrode 131, the second electrode 132, and the third electrode 133, to which the RF power is applied to generate the plasma in the discharge space, may be disposed in the recesses 115 outside the tube 110 to prevent the first to third electrodes 131, 132, and 133 and the protective pipe 170 from being damaged.

In an exemplary embodiment, the RF power may be individually supplied to two electrodes by using a three-electrode structure in which the second electrode 132 is provided to be grounded between the first electrode 131 and the third electrode 133 to which the RF power is respectively applied. Thus, the power required for obtaining a desired amount of radicals may be reduced to reduce an amount of particles to be generated or prevent the particles from being generated when compared to the case in which the high RF power is applied to one electrode.

Also, in an exemplary embodiment, the pulsed RF power may be supplied to the first electrode 131 and the third electrode 133. The pulsed RF power may be adjusted in pulse width and duty ratio in a pulse frequency range of approximately 1 kHz to approximately 10 kHz. When the pulsed RF power is applied to the first electrode 131 and the third electrode 133, the plasma may be periodically turned on/off, i.e., the plasma may be generated in the form of a pulse. Thus, the density of the ions that damage the partition wall and generate the particles during the processing process may be reduced, whereas the density of the radicals may be constantly maintained (see FIG. 8). In accordance with the exemplary embodiment, the partition wall 135 may be prevented from being damaged by the plasma while maintaining the efficiency of the processing process. In general, the RF power may have a frequency of approximately 0.1 MHz to several hundred MHz.

The densities of the plasma generated between the first electrode 131 and the second electrode 132 and between the second electrode 132 and the third electrode 133 may be non-uniform due to various factors. However, in an exemplary embodiment, the RF power having the different intensities may be respectively applied to the first electrode 131 and the third electrode 133 in the variable power supply unit 180 to generate the uniform plasma in the space between the first electrode 131 and the second electrode 132 and the space between the second electrode 132 and the third electrode 133. The variable power supply unit 180 for respectively applying the RF power having different intensities to the first electrode 131 and the third electrode 133 will be described later in detail.

The first electrode 131, the second electrode 132, the third electrode 160, and the gas supply pipe 160 may be disposed to be spaced apart from each other in the circumferential direction of the tube 110. At least one gas supply pipe 160 may be disposed outside the partition wall 135. For example, as illustrated in FIG. 1, two gas supply pipes 160 may be respectively disposed at one side and the other side of the partition wall 135 in the circumferential direction of the tube 110.

A plurality of injection holes 120 through which the radicals of the process gas decomposed in the plasma reaction unit 130 are injected into the processing space may be defined in the plasma reaction unit 130. The plurality of injection holes 120 may be defined in the main sidewall 135c of the partition wall 135. The main sidewall 135c may include a plurality of injection holes 120 in positions corresponding between the first electrode 131 and the second electrode 132 and between the second electrode 132 and the third electrode 133. Thus, the process gas supplied from the gas supply pipe 160 may be sufficiently decomposed by the plasma generated between the first electrode 131 and the second electrode 132 and between the second electrode 132 and the third electrode 133, and thus, a desired amount of radicals may be supplied to the processing space.

Figure 4:
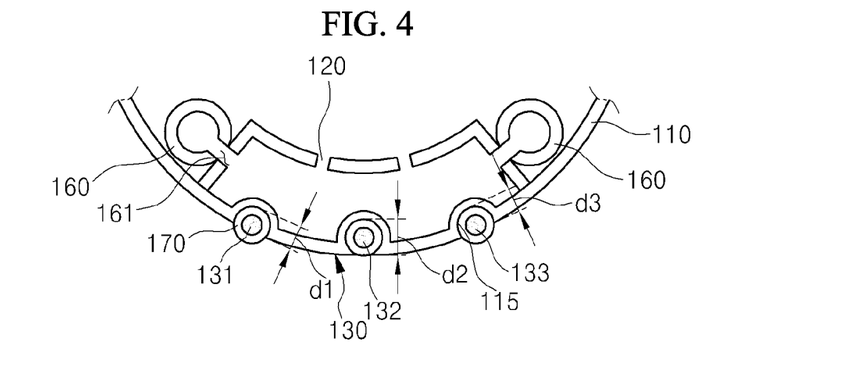
FIG. 4 is a plan view of a substrate processing apparatus in accordance with an exemplary embodiment.

FIG. 4 is a plan view of a substrate processing apparatus in accordance with an exemplary embodiment.

Referring to FIG. 4, the substrate processing apparatus according to an embodiment of the present invention is the same as or similar to the substrate processing apparatus of FIG. 3 except for recesses, and thus, following description will mainly focus on differences.

In an exemplary embodiment, unlike FIG. 3, when based on the outermost circumferential surface of the tube 110, at least one of the plurality of recesses 115 may have a depth different from that of each of the rest recesses 115. For example, when based on the outermost circumferential surface of the tube 110, the recess 115 that is disposed at an intermediate portion among the plurality of recesses 115 may have a depth d2 greater than that d1 of each of the recesses 115 that are disposed at outer sides. Here, the outermost circumferential surface of the tube 110 means the outermost circumferential surface except for the recesses 115. As described above, since the recess 115 that is disposed at the intermediate portion among the plurality of recesses 115 has the depth greater than that of each of the recesses 115 that are disposed at the outer sides, the second electrode 132 accommodated in the intermediate recess 115 and the ground electrode may be disposed deeper into the discharge space, and a high-density plasma generation region between the first electrode 131 and the second electrode 132 and between the second electrode 132 and the third electrode 133 may be expanded. Since the process gas within the supply pipe 160 may be discharged from the gas supply pipe 160 disposed outside the partition wall 135 via the expanded high-density plasma generation region in the circumferential direction of the tube 110, the plasma decomposition efficiency of the process gas may be improved. Thus, the high-density radicals may be supplied to the processing space.

Figure 5:
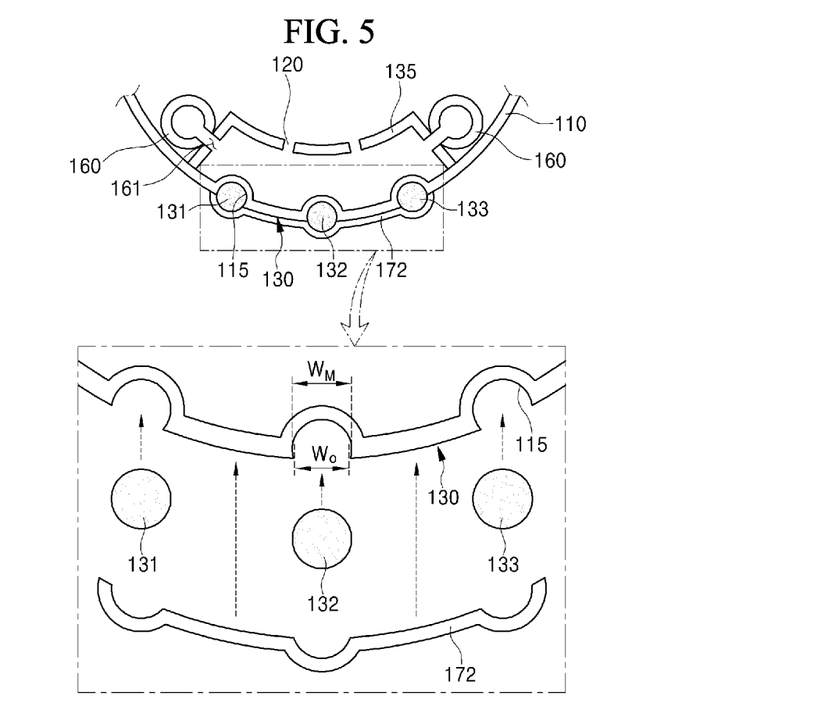
FIG. 5 is a plan view of a substrate processing apparatus in accordance with an embodiment.

FIG. 5 is a plan view of a substrate processing apparatus in accordance with an exemplary embodiment.

The substrate processing apparatus according to an exemplary embodiment is the same as or similar to the substrate processing apparatus of FIG. 3 except for a structure around the electrode, and thus, following description will mainly focus on differences.

In an exemplary embodiment, unlike FIG. 3, a plurality of electrodes 131, 132, and 133 accommodated in a plurality of recesses 115 may not be surrounded by a protective pipe 170. The plurality of electrodes 131, 132, and 133 may contact inner surfaces of the plurality of recesses 115, respectively. The plurality of electrodes 131, 132, and 133 accommodated in the plurality of recesses 115 may be disposed deeper into a discharge space. Thus, the high-density plasma generation regions between the first electrode 131 and the second electrode 132 and between the second electrode 132 and the third electrode 133 may be expanded. Since the process gas within the supply pipe 160 may be discharged from the gas supply pipe 160 disposed outside the partition wall 135 via the expanded high-density plasma generation region in the circumferential direction of the tube 110, the plasma decomposition efficiency of the process gas may be improved. Thus, the high-density radicals may be supplied to the processing space.

In this case, as necessary, a protective cover 172 covering the plurality of electrodes 131, 132, and 133 and a portion of an outer wall of the tube 110 may be further provided. The protective cover may serve to protect the plurality of electrodes 131, 132, and 133 against external environments or support the plurality of electrodes 131, 132, and 133.

Figure 6:
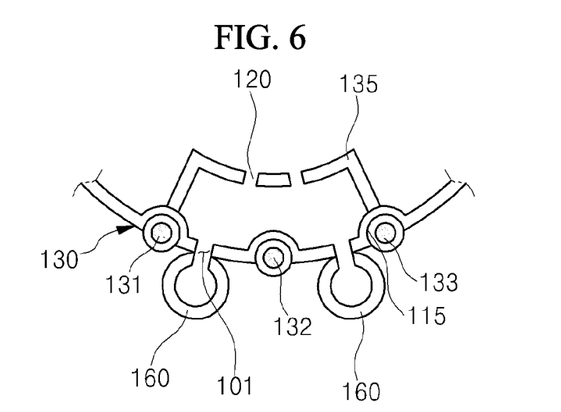
FIG. 6 is a plan view of a substrate processing apparatus in accordance with an embodiment.

FIG. 6 is a plan view of a substrate processing apparatus in accordance with an exemplary embodiment.

The substrate processing apparatus according to an embodiment of the present invention is the same as or similar to the substrate processing apparatus of FIG. 3 except for a plasma reaction unit 130 and a gas supply pipe 160, and thus, following description will mainly focus on differences.

The plurality of electrodes 131, 132, and 133 include a first electrode 131, a second electrode 132, and a third electrode 133, which are disposed outside the tube 110 and respectively accommodated in the plurality of recesses 115. Each of the first electrode 131, the second electrode 132, and the third electrode 133 may be accommodated in the plurality of recesses 115 in a state of being surrounded by the protective tube 170 from an upper portion to a lower portion thereof. The second electrode 132 may be accommodated in the recess 115 defined in an intermediate portion of the plurality of recesses 115, and the first and third electrodes 131 and 133 may be accommodated in the recesses 115, which are disposed at outer sides of the plurality of recesses 115.

The partition wall 135 may extend from the recesses 115 that are disposed at the outer sides among the plurality of recesses 115. That is, the partition wall 135 may extend from the recesses 115 in which the first electrode 131 and the third electrode 133 are accommodated to provide a discharge space.

A plurality of gas supply pipes 160 may supply a process gas to a space between the plurality of electrodes 131, 132, and 133 from the outside of the tube 110. The plurality of supply pipes 160 are disposed outside the tube 110, that is, are disposed outside from a line connecting central axes of the first to third electrodes 131, 132, and 133 to each other. Also, supply holes 161 of the plurality of gas supply pipes 160 may be defined to face spaces between the first electrode 131 and the second electrode 132 and between the second electrode 132 and the third electrode 133, respectively.

When the supply holes 161 of the plurality of gas supply pipes 160 are defined toward a space between the first electrode 131 and the second electrode 132 and a space between the second electrode 132 and the third electrode 133, the process gas supplied through the supply holes 161 of the plurality of gas supply pipes 160 may be directly supplied into discharge spaces between the first electrode 131 and the second electrode 132 and between the second electrode 132 and the third electrode 133. Thus, an eddy may not be generated inside the partition wall 135, and a time taken to diffuse the process gas into the discharge space may be reduced to improve a decomposition rate of the process gas and a plasma decomposition rate.

Also, since the discharge space that is surrounded by the partition wall 135 and a portion of the tube 110 may be reduced in size to reduce the time taken to uniformly diffuse the process gas supplied to the discharge space. Thus, the process gas may be decomposed by the plasma to reduce a time taken to supply the process gas to the processing space.

The injection holes 120 and the supply holes 161 may be provided to be dislocated from each other with respect to a radical direction of the tube 110. When the injection holes 120 and the supply holes 161 do not correspond to each other but are dislocated from each other as illustrated in FIG. 6, the process gas supplied through the supply holes 161 may not be directly discharged through the injection holes 120 of the tube 110 but have a margin for the decomposition by the plasma to improve the plasma decomposition efficiency. The process gas supplied through the supply holes 161 may be sufficiently decomposed by the plasma, and the high-density radicals may be supplied to the processing space.

Figure 7A:
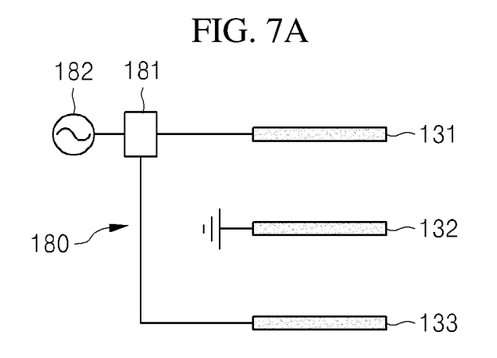
FIGS. 7A, 7B and 7C are circuit diagrams illustrating RF power supply methods in accordance with some exemplary embodiments.
Figure 7B:
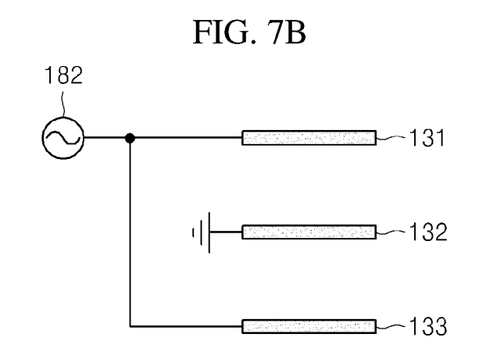
Figure 7C:
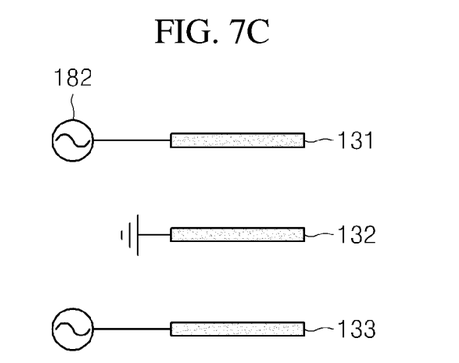

FIGS. 7A, 7B and 7C are circuit diagrams illustrating RF power supply methods in accordance with some exemplary embodiments.

Referring to FIG. 7A, a variable power supply unit 180 may include an RF power source 182 supplying RF power to the first and third electrodes 131 and 133 and RF splitters 181 which are respectively provided between the RF power source 182 and a first electrode 131 and between the RF power source 182 and a third electrode 133 to adjust an intensity and ratio of the RF power.

The non-uniform plasma generation in which the density of the plasma generated between the first electrode 131 and the second electrode 132 and the density of the plasma generated between the second electrode 132 and the third electrode 133 are different from each other may occur due to various factors. In an exemplary embodiment, the RF power applied to each of the first electrode 131 and the third electrode 133 may be adjusted in intensity and ratio by using the variable power supply unit 180 so as to generate the uniform plasma. The RF splitters 181 may adjust the intensity or ratio of the RF power supplied from the electrically connected RF power source 182 so that the RF power having different intensities are respectively applied to the first electrode 131 and the third electrode 133.

The variable power supply unit 180 may further include probes, which are respectively provided between the first electrode 131 and the second electrode 132 and between the second electrode 132 and the third electrode 133 to measure discharge characteristics (discharge current, discharge voltages, phases, etc.) of the plasma. Thus, the RF power may be adjusted in intensity and ratio in accordance with a difference in discharge characteristic measured from the probes.

Referring to FIG. 7C, the first electrode 131 and the third electrode 133 may be electrically connected to two RF power sources 182 to independently receive the RF power so as to generate the uniform plasma.

Referring to FIG. 7B, when the densities of the plasma generated between the first electrode 131 and the second electrode 132 and between the second electrode 132 and the third electrode 133 are uniform, the RF power output from one RF power source 182 may be equally distributed to be supplied to the first electrode 131 and the third electrode 133.

Also, the RF power source 182 may supply pulsed RF power to the first electrode 131 and the third electrode 133. The pulsed RF power may be adjusted in pulse width and duty ratio in a pulse frequency range of approximately 1 kHz to approximately 10 kHz.

In accordance with the exemplary embodiment, the process gas supplied from the gas supply pipe may be decomposed in the separate discharge space that is separated from the processing space so as to be provided into the processing space, thereby preventing particles from being separated from the inner wall of the tube.

In accordance with the exemplary embodiment, the electrodes may be disposed in the recesses of the tube to generate the plasma in the discharge space, thereby preventing the electrodes and the protective pipe from being damaged by the plasma.

In accordance with the exemplary embodiment, since the gas supply pipe is disposed outside the partition wall to directly supply the process gas into the discharge space inside the partition wall, the eddy may not occur inside the partition wall, and also, the uniform pressure may be generated in the discharge space within the short time.

In accordance with the exemplary embodiment, the gas supply pipe may be disposed outside the partition wall, and also, the electrodes may be disposed in the recesses to reduce the size of the discharge space and generate the uniform pressure in the discharge space within the short time.

In accordance with the exemplary embodiment, the pulsed RF power may be supplied to the electrode to reduce the density of the ions during the processing while constantly maintaining the density of the radicals. In accordance with the exemplary embodiment, the partition wall may be prevented from being damaged by the plasma while maintaining the efficiency of the processing process.

As described above, while this invention has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A batch type substrate processing apparatus comprising:
   a tube configured to provide a processing space in which a plurality of substrates are accommodated;
   a partition wall extending in a longitudinal direction of the tube and disposed inside the tube to provide a discharge space which is separated from the processing space and in which plasma is generated;
   a gas supply pipe configured to supply a process gas required for processing the plurality of substrates to the discharge space; and
   a plurality of electrodes extending in the longitudinal direction of the tube and disposed outside the tube to generate the plasma in the discharge space,
   wherein the tube has a plurality of recesses recessed inward from the outermost circumferential surface of the tube,
   wherein each of the plurality of recesses extends in the longitudinal direction of the tube, and
   wherein the plurality of electrodes are accommodated along the longitudinal direction of the tube in the plurality of recesses, respectively, and are disposed outside the discharge space.

2. The batch type substrate processing apparatus of claim 1, wherein the plurality of recesses are disposed to be spaced apart from each other in a circumferential direction of the tube.

3. The batch type substrate processing apparatus of claim 1, wherein distances between the plurality of recesses are the same.

4. The batch type substrate processing apparatus of claim 1, wherein an opened inlet of each of the plurality of recesses has a width less than a maximum width of an inner space of each of the plurality of recesses, in a circumferential direction of the tube.

5. The batch type substrate processing apparatus of claim 1, wherein at least one of the plurality of recesses has a depth different from that of the rest of the plurality of recesses, when based on the outermost circumferential surface of the tube.

6. The batch type substrate processing apparatus of claim 5, wherein the plurality of electrodes comprise a plurality of power electrodes to which RF power is applied and a ground electrode that is grounded, and
   the recess which is disposed at an intermediate portion and in which the ground electrode is accommodated has a depth greater than that of each of the rest recesses among the plurality of recesses.

7. The batch type substrate processing apparatus of claim 1, wherein a first portion of the surface of each of the plurality of electrodes contacts inner surfaces of the plurality of recesses, respectively, and
   the batch type substrate processing apparatus further comprises a protective cover configured to cover a second portion of the surface of each of the plurality of electrodes respectively accommodated in the plurality of recesses to protect the plurality of electrodes against an external environment.

8. The batch type substrate processing apparatus of claim 1, wherein the gas supply pipe is disposed outside the partition wall in the circumferential direction of the tube.

9. The batch type substrate processing apparatus of claim 1, wherein the partition wall extends from each of the recesses that are disposed at outer sides among the plurality of recesses.

10. The batch type substrate processing apparatus of claim 9, wherein the gas supply pipe supplies the process gas into spaces between the plurality of electrodes from outside of the tube.

11. The batch type substrate processing apparatus of claim 1, further comprising an RF power source configured to supply pulsed RF power having a pulse frequency band of approximately 1 kHz to approximately 10 kHz to a portion of the plurality of electrodes so that the plasma is periodically turned on/off.

* * * * *